United States Patent [19]
Harada

[11] Patent Number: 5,265,773
[45] Date of Patent: Nov. 30, 1993

[54] PASTE FEEDING APPARATUS

[75] Inventor: Manabu Harada, Tokyo, Japan

[73] Assignee: Kabushiki Kaisha Marukomu, Tokyo, Japan

[21] Appl. No.: 881,267

[22] Filed: May 11, 1992

[30] Foreign Application Priority Data

May 24, 1991 [JP] Japan ................................. 3-148193
Feb. 12, 1992 [JP] Japan ................................. 4-057825

[51] Int. Cl.⁵ ........................................... G01F 11/00
[52] U.S. Cl. .................................. 222/261; 222/241; 222/242; 222/334; 222/413
[58] Field of Search ............... 222/260, 261, 262, 334, 222/241, 242, 413, 389

[56] References Cited

U.S. PATENT DOCUMENTS

| | | | |
|---|---|---|---|
| 2,589,583 | 3/1952 | Thompson | 222/241 X |
| 3,240,400 | 3/1966 | Smith | 222/261 X |
| 5,080,264 | 1/1992 | Limper | 222/241 |

FOREIGN PATENT DOCUMENTS

| | | |
|---|---|---|
| 2074240 | 10/1981 | European Pat. Off. |
| 0351899 | 1/1990 | European Pat. Off. |
| 1148961 | 12/1957 | France |
| 1200980 | 12/1959 | France |
| 1-22032 | 3/1989 | Japan |
| 719263 | 12/1954 | United Kingdom .............. 222/241 |

OTHER PUBLICATIONS

World Patents Index Latest, Section Ch, Week 9024, 25 Jul. 1990, Derwent Publications, Ltd., London GB; Class A, AN 90-182943 & SU-A-1 503 873 (Kharinskii) 30 Aug. 1989.
Patent Abstracts of Japan, vol. 6, No. 223 (C-133) (1101) 9 Nov. 1982 and JP-A-57 127 431 (Nitsukuu Kogyo K.K.), 7 Aug. 1982.
World Patents Index Latest, Section Ch, Week 9128, 28 Aug. 1991, Derwent Publications Ltd., London GB, Class J, AN 91-205729 [28] & SU-A-1 586 760 (Gorev), 23 Aug. 1990.

Primary Examiner—Gregory L. Huson
Attorney, Agent, or Firm—Oliff & Berridge

[57] ABSTRACT

The paste feeding apparatus is equipped, within a cylindrical container having a paste feeding opening at its lower end, with a spiral pump composed of a vertical mantle tube having a paste inlet and a paste outlet, which are spacedly formed at lower and upper positions, respectively, and a screw shaft provided coaxially within the mantle tube; a drive motor connected to the screw shaft; and a piston moving up and down in an annular space in the container. A raking blade which is connected to the screw shaft and serves to rake a paste in the paste inlet of the mantle tube may be provided. The paste feeding apparatus is composed of a drive section and a pump-container section detachably installed thereto. According to the paste feeding apparatus, the kneading of a paste, the adjustment of its viscosity and the control of its feed rate can be stably achieved with high precision, and hence high reliability can be attained.

10 Claims, 8 Drawing Sheets

F I G. 10
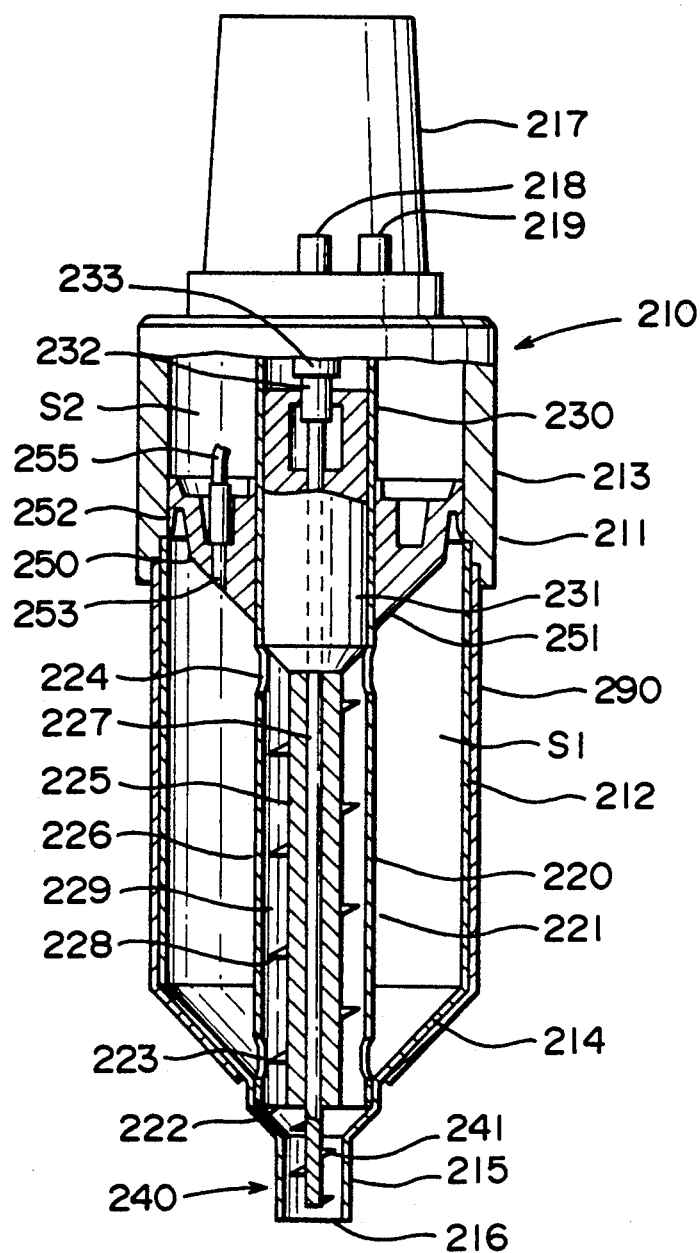

PASTE FEEDING APPARATUS

FIELD OF THE INVENTION

The present invention relates to a paste feeding apparatus suitable for use, for example, in feeding a pasty ink to a screen printing machine.

BACKGROUND OF THE INVENTION

Electric circuit devices are generally fabricated by mounting various kinds of circuit elements on a chip consisting of a printed circuit board However, a demand for more improving mounting efficiency is recently increasing. In order to meet such a demand, it is required to print various patterns with a soldering paste, pasty resist ink, adhesive paste or the like on printed circuit boards with high precision and efficiency. In general, screen printing is favorably used for printing fine patterns with such a paste. In order to satisfactorily perform such screen printing, it is necessary to thoroughly knead a paste or ink to be fed onto a screen so as to make its property uniform, and to certainly carrying out the adjustment of its viscosity and the control of its feed rate.

The feed of a paste to a screen printing machine has heretofore been carried out manually by an operator in most cases. Namely, the operator has kneaded the paste by means of a spatula and also controlled its viscosity and feed rate on his experiential judgment Recently, there has also been proposed a paste feeding apparatus in which a paste in a container is extruded from the container by a piston provided on the upper part of the container.

However, the manual feeding of the paste by the operator makes it extremely difficult to practically effect the kneading of the paste, the adjustment of its viscosity and the control of its feed rate with identical reproducibility at all times. It is therefore impossible to ensure high reliability. On the other hand, the conventional paste feeding apparatus serves only to feed a paste mechanically and hence involves a problem that it can not substantially knead the paste and also scarcely conduct the adjustment of its viscosity and the control of its feed rate.

The paste feeding apparatus is also accompanied by a problem that although the paste remaining in its container at the time its use has been ended must be stored under suitable conditions, the container portion alone can not be received in a refrigerator or the like to store the paste because an agitator is integrally incorporated in this apparatus.

SUMMARY OF THE INVENTION

It is an object of the present invention to provide a paste feeding apparatus by which the above-described problems can be solved, the kneading of a paste, the adjustment of its viscosity and the control of its feed rate can be stably achieved with high precision, and hence high reliability can be attained.

It is another object of this invention to provide a paste feeding apparatus, which basically permits the achievement of the above object, and comprises a drive section and a pump-container section detachably installed to the drive section and removable from the drive section as necessary.

According to the present invention, there is thus provided a paste feeding apparatus comprising a vertical cylindrical container; a paste feeding opening defined in a lower end of the container; a spiral pump composed of a mantle tube vertically provided within the container and having a paste inlet and a paste outlet, which are spacedly formed at lower and upper positions, respectively, and having an outside diameter smaller than an inside diameter of the container, and a screw shaft provided coaxially within the mantle tube and having a spiral blade or groove; a drive motor provided in connection with the screw shaft of the spiral pump; and a piston moving up and down in an annular space about the mantle tube in the container.

In the paste feeding apparatus according to this invention, the container may preferably have a vertical cylindrical paste-feeding part having a smaller diameter at its lower end, in the interior of said cylindrical paste-feeding part being formed a spiral blade or groove in the same direction as that of the screw shaft.

The paste feeding apparatus may preferably comprise further a raking blade which is connected to the screw shaft to be rotated and serves to rake a paste in the paste inlet of the mantle tube.

The ranking blade may preferably have an outer blade portion for moving the paste on the inside along the radial direction by its rotation and an inner blade portion for lifting the paste moved on the inside along the radial direction to introduce it into the paste inlet.

The paste feeding apparatus may preferably comprises a drive section and a pump-container section, said pump-container section being composed of a vertical cylindrical container; a paste feeding opening defined in a lower end of the container; a spiral pump composed of a mantle tube vertically provided within the container and having a paste inlet and a paste outlet, which are spacedly formed at lower and upper positions, respectively, and having an outside diameter smaller than the inside diameter of the container, and a screw shaft provided coaxially within the mantle tube and having a spiral blade or groove; and a piston moving up and down in an annular space about the mantle tube in the container, and said drive section comprising a drive motor detachably connected to the screw shaft of the spiral pump and a piston-driving source detachably connected to the piston.

According to the paste feeding apparatus of the present invention, the paste contained in the container can be thoroughly kneaded because it is caused to circulate in the container by the spiral pump. In addition, the viscosity of the paste can be detected by detecting the load of the spiral pump through its screw shaft. Therefore, the viscosity of the paste can be adjusted by controlling the degree of kneading according to the resulting viscosity information. In the case where a raking blade is provided on the screw shaft, the paste can be surely introduced into the spiral pump by this raking blade. The above-described operation can hence be performed with certainty. Further, since the paste in the container becomes a uniform and controlled condition, the feed rate of the paste can be accurately controlled. Furthermore, the action of the piston makes it possible to stably achieve the above-described operation.

Since the pump-container section may be detachably installed to the drive section, it is also possible to remove the pump-container section from the drive section at the time it is out of use to store it under suitable conditions, and hence to prevent the deterioration of the unused paste remaining in the container.

BRIEF DESCRIPTION OF THE DRAWINGS

The above and other objects, features and advantages of the present invention will become apparent from the following description and the appended claims, taken in conjunction with the accompanying drawings, in which:

FIG. 10 is a cross-sectional view illustrating a construction of a paste feeding apparatus according to the second embodiment of this invention;

DETAILED DESCRIPTION OF THE INVENTION AND PREFERRED EMBODIMENTS

Figure 1:
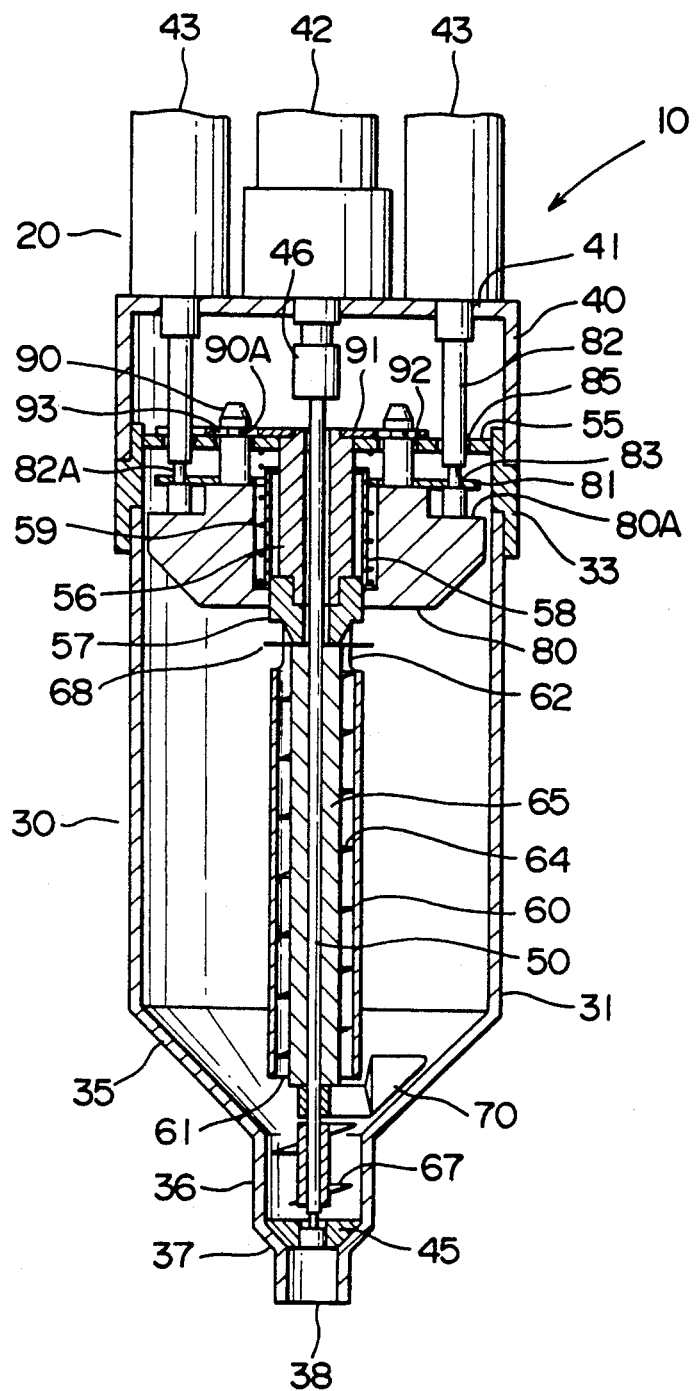
FIG. 1 is a cross-sectional view illustrating a construction of a paste feeding apparatus according to the first embodiment of this invention.
Figure 2:
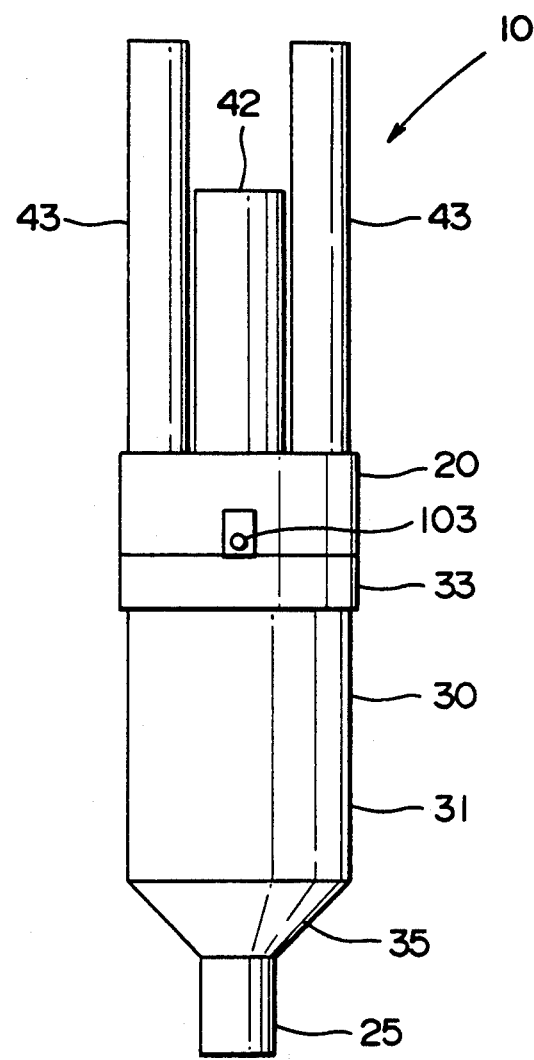
FIG. 2 is an elevational view illustrating the appearance of the paste feeding apparatus according to the first embodiment of this invention.

FIG. 1 is a cross-sectional view illustrating an exemplary basic construction of a paste feeding apparatus 10 according to the first embodiment of the present invention, and FIG. 2 is a view illustrating the whole appearance thereof.

This paste feeding apparatus 10 basically comprises a drive section 20 and a pump-container section 30. The pump-container section 30 is composed of a vertical cylindrical container 31 and a cylindrical coupling part 33 screwed on the outer peripheral surface of the upper end of the container 31 and detachably connected to the drive section 20.

A vertical cylindrical paste-feeding part 36 having a smaller diameter is integrally formed through a conical part 35 at the lower end of the container 31. A paste feeding opening 38 is defined through a bearing holding part 37 at the lower end of the cylindrical paste-feeding part 36. In FIG. 2, reference numeral 25 designates a cap provided on the cylindrical paste-feeding part 36.

The drive section 20 has a cylindrical cap part 40 and is connected to the coupling part 33 at this cap part 40 by a detachable interlocking mechanism which will be described subsequently. On a top plate 41 of the cap part 40, are disposed a drive motor 42 and air cylinders 43 for driving a piston described below. A drive shaft 50 vertically extending in the container 31 along a center axis thereof and rotatably supported at its lower end on a bearing 45 provided in the bearing holding part 37 of the container 31 is provided. The upper end of the drive shaft 50 is connected to the drive motor 42 through a coupling 46 detachably provided.

The coupling section 33 integrally has a supporting plate part 55 to the center of which a support column 56 having a through-hole through which the drive shaft 50 is inserted is fixed so as to extend downward. The lower end of the support column 56 is connected through a connecting sleeve 57 to the upper end of a mantle tube 60 having an outside diameter smaller than an inside diameter of the container 31. The lower end of the mantle tube 60, which is situated within the conical part 35 of the container 31, is opened to define a paste inlet 61. Moreover, a paste outlet 62 is defined at the upper end of the mantle tube 60 by cutting a hole through a peripheral wall of the mantle tube 60. A scraping member 68 composed of an annular elastic material is provided at the lower end of the connecting sleeve 57 so as to close the paste outlet 62 at the time it is bent downward.

In FIG. 1, reference numeral 58 indicates a sliding sleeve which is vertically movably provided in a space between the outer peripheral surfaces of the support column 56 and connecting sleeve 57 and the inner peripheral surface of a piston 80 described below. A bottom edge of this sliding sleeve 58 is engaged with an inwardly protrudent edge of the piston 80. The sliding sleeve 58 is always biased downward by a large-expanded coil spring 59 interposed between the supporting plate part 55 and the bottom edge of the sliding sleeve 58.

The drive shaft 50 is inserted through the support column 56, the connecting sleeve 57 and the mantle tube 60. In the region of the mantle tube 60, a screw shaft 65 having a spiral blade 64 is fixed around the outer periphery of the drive shaft 50, and a spiral pump for circulating the paste is constructed by the mantle tube 60 having the paste inlet 61 and the paste outlet 62, and the screw shaft 65.

Figure 3A:
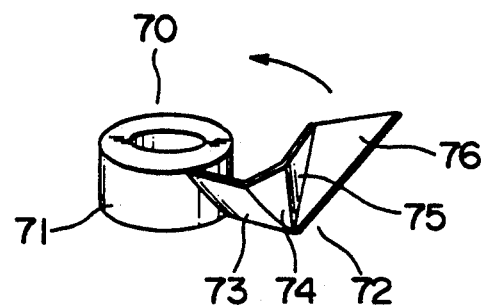
FIGS. 3(A) and 3(B) are a perspective view and a side view, respectively, illustrating a raking blade in the paste feeding apparatus according to the first embodiment of this invention.
Figure 3B:
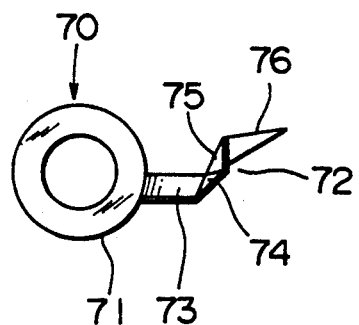

At a position downward from the paste inlet 61 situated at the lower end of the mantle tube 60, a raking blade 70 is provided on the drive shaft 50 so as to rotate along with the shaft 50 within the conical part 35 of the container 31. In FIGS. 3(A) and 3(B), an exemplary raking blade 70 suitable for use in this invention is illustrated. The raking blade 70 in this embodiment is composed of a cylindrical base part 71 fixed to the drive shaft 50 and a blade part 72 provided on the outer peripheral surface of the base part 71 and formed of a sheet-like material.

The blade part 72 is composed of an inner part 73 for dipping up the paste, which extends radially on the outside from the base part 71 and obliquely in its rotational direction as it comes down, an intermediate part 74, an outer part 75 for taking in the paste, which is formed integrally with the inner part 73 through the intermediate part 74 and extends in its rotational direction along the tangential direction, and a tip part 76 for pushing down the paste, which extends radially on the outside and obliquely in a direction opposite to its rotational direction as it comes down.

On a further lower portion of the drive shaft 50, a spiral blade 67 in the same direction as that of the spiral blade 64 is fixedly provided so as to rotate along with the shaft 50 within the cylindrical paste-feeding part 36 of the container 31. This constructs a paste feeding section.

Within the container 31 is provided the piston 80 which moves up and down in an annular space defined between the mantle tube 60 and the container 31 in a state substantially fitted on the outer peripheral surface of the mantle tube 60. A cylinder head locking plate 81 is fixed to the top surface of the piston 80. This cylinder head locking plate 81 has interlocking holes 83 through which their corresponding rod-like cylinder heads 82 extending downward from the air cylinders 43 are inserted to detachably engage them with the cylinder head locking plate 81.

Figure 4:
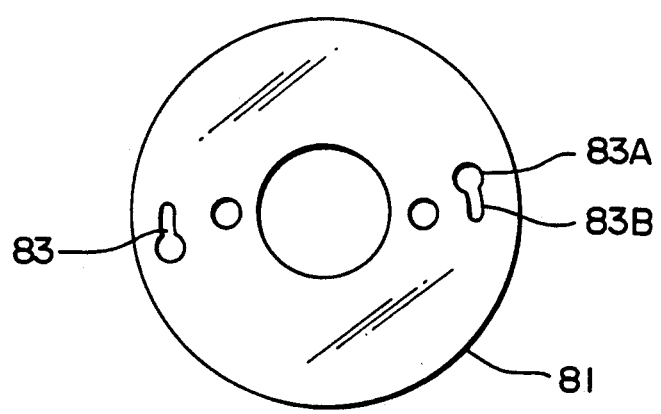
FIG. 4 is a plan view illustrating a cylinder head locking plate in the paste feeding apparatus according to the first embodiment of this invention.

Described specifically, each of the cylinder heads 82, which separately extend from the supporting plate part 55 through arcuate through-holes 85 cut in the supporting plate part 55, has an annular groove 82A formed in the outer periphery of its lower end. As illustrated in FIG. 4, the interlocking holes 83 each have a configuration with a large-diameter area 83A having an inside diameter larger than an outside diameter of the cylinder head 82 and a small-diameter area 83B having an inside diameter smaller than the outside diameter of the cylinder head 82 but fit for the shaft part, in which the annular groove 82A has been formed, defined continuously in a circumferential direction. Therefore, in an uninterlocked state that each cylinder head 82 is situated in the large-diameter area 83A, the cylinder head 82 can be moved up and down relative to the cylinder head locking plate 81. On the other hand, in an interlocked state that the cylinder head 82 is situated in the small-diameter area 83B, the annular groove 82A in the cylinder head 82 is fitted on the cylinder head locking plate 81, whereby both cylinder head 82 and cylinder head locking plate 81 are integrally connected to each other. When the cylinder head 82 is in the interlocked state, its lower end surface comes into contact with an upper surface 80A of an outer peripheral edge of the piston 80.

Figure 5:
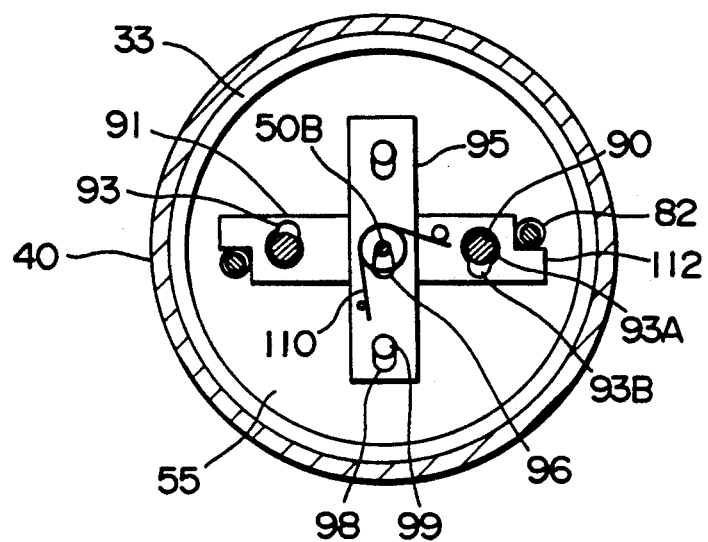
FIG. 5 is a plan view illustrating a piston locking plate and a drive shaft holding member in the paste feeding apparatus according to the first embodiment of this invention.
Figure 6:
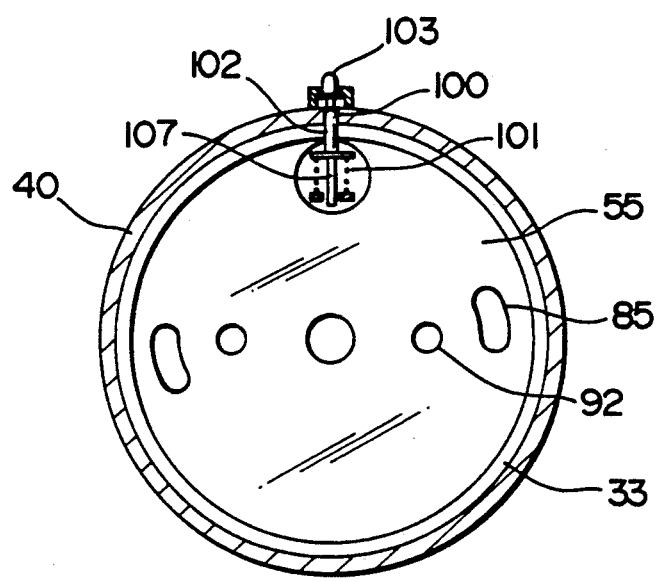
FIG. 6 is a plan view illustrating an interlock-releasing button and a supporting plate part in a coupling part in the paste feeding apparatus according to the first embodiment of this invention.

Further, piston locking pins 90 each having an annular groove 90A at outer peripheries of their upper ends, are fixed to the upper surface of the piston 80 so as to project upward. As also illustrated in FIG. 6, pin-passing holes 92 fit for the outside diameter of the piston locking pin 90 are defined in the supporting plate part 55 of the coupling part 33. Each of the piston locking pins 90 is inserted in the supporting plate part 55 through this pin-passing hole 92. A piston locking plate 91 is rotatably provided on the supporting plate part 55. As illustrated in FIG. 5, interlocking holes 93 adapted to detachably engage with the piston locking pins 90 are defined in this piston locking plate 91.

Described specifically, each of the interlocking holes 93 has a configuration with a large-diameter area 93A having an inside diameter larger than an outside diameter of the piston locking pin 90 and a small-diameter area 93B having an inside diameter smaller than the outside diameter of the piston locking pin 90 but fit for the shaft part, in which the annular groove 90A has been formed, defined continuously in a circumferential direction. Therefore, in an uninterlocked state (a state illustrated in FIG. 5) that each piston locking pin 90 is situated in the large-diameter area 93A of the interlocking hole 93, the piston locking pin 90 can be moved up and down relative to the piston locking plate 91. On the other hand, in an interlocked state that the piston locking pin 90 is situated in the small-diameter area 93B, the annular groove 90A in the piston locking pin 90 is fitted on the piston locking plate 91, whereby both piston locking pin 90 and piston locking plate 91 are integrally connected to each other.

In the above description the interlocking holes 83 in the cylinder head locking plate 81 form a pair with their corresponding interlocking holes 93 in the piston locking plate 91 at intended positions in a radial direction. When the cylinder heads 82 are in an interlocked state relative to the cylinder locking plate 81, the piston locking pins 90 are in an uninterlocked state relative to the piston locking plate 91.

A cylindrical upper portion of the coupling part 33 is slidably fitted in the cylindrical cap part 40 of the drive section 20 along the inner surface of its peripheral wall. In order to remove the coupling part 33 from the drive section 20, the coupling part is provided with a guiding mechanism (not illustrated) which permits the movement of the coupling part 33 in a circumferential direction relative to the drive section 20 and then its downward movement in an axial direction. Guide mechanisms of various types may be used as this guide mechanism. For example, this mechanism is made up of a protruding pin and a guide groove for guiding this protruding pin. As illustrated in FIG. 6, the supporting plate part 55 in the coupling part 33 is provided with a protruding piece 102 which is inserted in a through-hole 100 defined in the cap part 40 in the drive section by the elastic action of a spring 101 to engage with the through-hole 100. Moreover, on the outer peripheral surface of the cap part 40, there is provided an interlock-releasing button 103 which serves to force the protruding piece 102 down against the spring 101 to release the engagement of the protruding piece 102 with the through-hole 100.

As also illustrated in FIG. 5, a drive shaft holding member 95 is further provided on the piston locking plate 91. This drive shaft holding member 95 is omitted in FIGS. 1 and 8. The drive shaft holding member 95 has the function of preventing the drive shaft 50 from falling off upon the removal of the coupling part 33 from the drive section 20.

Described specifically, the drive shaft holding member 95 is supported movably in a vertical direction in FIG. 5 by long holes 98 defined in the drive shaft holding member 95 and guide pins 99 formed on the supporting plate part 55 and inserted in their corresponding long holes 98. The drive shaft holding member 95 is always biased by the above-described spring 101 in a state shifted downward as illustrated in FIG. 5.

Figure 7A:
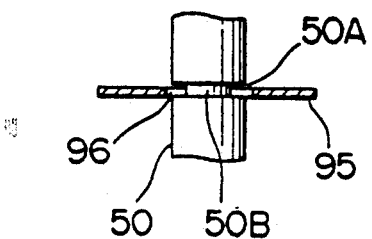
FIGS. 7(A) and 7(B) are a cross-sectional view and a plan view, respectively, illustrating a relationship between a drive shaft holding member and a drive shaft in the paste feeding apparatus according to the first embodiment of this invention.
Figure 7B:
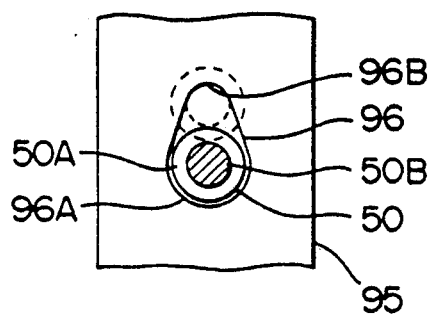

As illustrated on an enlarged scale in FIGS. 7(A) and 7(B), an annular groove 50A is formed in the outer periphery of the drive shaft 50 at a position just below its upper end connected to the coupling 46. Besides, an interlocking hole 96, through which the drive shaft 50 is inserted to detachably engage it with the drive shaft holding member 95, is defined in the center of the drive shaft holding member 95. This interlocking hole 96 has a configuration with a large-diameter area 96A having an inside diameter larger than an outside diameter of the drive shaft 50 and a small-diameter area 96B having an inside diameter smaller than the outside diameter of the drive shaft 50 but fit for the shaft part 50B, in which the annular groove 50A has been formed, defined continuously in a vertical direction in a state that the large-diameter area 96A is situated downward in FIG. 7(B).

Therefore, in an interlocked state that the drive shaft holding member 95 is moved downward by the action of the spring 101 as shown in FIG. 5 and the shaft part 50B of the drive shaft 50 is situated in the small-diameter area 96B, the drive shaft 50 is held by the drive shaft holding member 95, thereby preventing the drive shaft 50 from falling off.

In order to release the engagement of the drive shaft 50 with the drive shaft holding member 95, it is only necessary to shift the drive shaft holding member 95 upward against the spring 101, for example, by fingers, in a state that the coupling part 33 has been separated from the drive section 20 as described below. In the disengaged state, the drive shaft holding member 95 is moved upward as shown in FIG. 7(B), so that the drive shaft 50 becomes an uninterlocked state that it is situated in the large-diameter area 96A of the interlocking hole 96, and is hence made movable relative to the drive shaft holding member 95.

As illustrated in FIG. 5, a spring 110 is provided on the drive shaft holding member 95. By this spring 110, the piston locking plate 91 is biased in a rotational direction (counter-clockwise direction in the drawing) interlocking with the piston locking pins 90. However, engaging parts 112 interlocking with their corresponding cylinder heads 82 in the rotational direction are formed on both ends of the piston locking plate 91. In the state illustrated in FIG. 5, the piston locking plate 91 is therefore in an uninterlocked state relative to the piston locking pins 90 against the spring 110 by their engagement.

The paste feeding apparatus 10 composed of the above-described components is operated in the following manner. Namely, in a using condition in which the pump-container section 30 has been connected to the drive section 20 as illustrated in FIG. 1, the cylinder head locking plate 81 in the coupling part 33 is in an interlocked state relative to the cylinder heads 82 of the air cylinders 43, and at the same time, the piston locking pins 90 are in an uninterlocked state relative to the piston locking plate 91.

In this condition, a paste to be fed is charged in the container 31, and the drive shaft 50 is rotated on its axis through the coupling 46 by the drive motor 42, whereby the screw shaft 65 is normally rotated. As a result, the paste in the mantle tube 60 is moved upward by the operation of the spiral blade 64 on the screw shaft 65, whereby the paste in the container 31 is introduced into the mantle tube 64 from its paste inlet 61, lifted up in the mantle tube 60 and then discharged in the container 31 from the paste outlet 62 situated at the upper position. Namely, the paste in the container 31 is circulated by the normally rotating operation of the spiral pump, and is kneaded by continuously conducting such normally rotating operation of the spiral pump. It is therefore possible to keep the paste uniform.

The drive shaft 50 is provided with the raking blade 70 at a position below the paste inlet 61 of the mantle tube 60. The rotation of this raking blade 70 makes the paste in the container 31 pushed down by the action of the tip part 76 of the blade part 72 for pushing down the paste, raked up inside by the action of its outer part 75 for taking in the paste and then dipped up upward by its inner part 73 for dipping up the paste. Accordingly, the paste is positively guided to the paste inlet 61 of the mantle tube 60 and introduced into the mantle tube 60. As a result, since the paste is surely fed to the spiral pump, the kneading of the paste as described above can be surely achieved with satisfactorily high efficiency.

While the spiral pump is normally operated as described above, in the inside of the cylindrical paste-feeding part 36, the spiral blade 67 in the same direction as that of the spiral blade 64 is operated in a direction lifting up the paste in the same manner as described above. Therefore, the paste is not leaked out of the paste feeding opening 38 due to its gravity.

When the drive shaft 50 for driving the spiral pump is provided with a torque meter for detecting its load, a detection torque signal of a magnitude according to a load applied to the screw shaft 65 is obtained from this torque meter. This signal is a signal according to the viscosity of the paste in the mantle tube 60. It is therefore possible to detect the viscosity of the paste in the container 31 by this detection torque signal. When the rotational speed of the screw shaft 65 is made high by was of example, the shearing force acting on the paste becomes great and the temperature of the paste rises, so that the viscosity of the paste becomes lowered. It is therefore possible to adjust the viscosity of the paste in the container 31 by controlling the rotational speed of the drive motor 42 and the like by a drive control system according to the detection torque signal.

When a heating/cooling mechanism for the paste in the container 31 is further provided, it is possible to control the temperature of the paste as an independent factor by controlling the operation of the heating/cooling mechanism in addition to the adjustment of the viscosity by the control of the drive motor 42, so that the viscosity of the paste in the container 31 can be adjusted extremely efficiently.

Further, the paste in the container 31, which has been subjected to the kneading and adjustment of viscosity as described above, can be fed by turning the rotating direction of the drive motor 42 to reversely operate the spiral pump. As a result, the paste in the mantle tube 60 is moved downward, and the paste in the container 31 is moved into the cylindrical paste-feeding part 36 and extruded through the paste feeding opening 38 by the action of the spiral blade 67. At this time, the piston 80 is lowered as described below to push down the paste, whereby the paste in an amount corresponding to the amount of the paste discharged from the paste feeding opening 38 can be pushed down. As a result, it is possible to carry out the feeding of the paste extremely smoothly and efficiently.

Since the amount of the paste fed through the paste feeding opening 38 by the reverse operation of the spiral pump as described above corresponds to the number or time of revolution of the spiral blade 67 in the paste feeding part, it is possible to control the amount of the paste to be fed through the paste feeding opening 38 with very high precision by controlling the reverse operation of the spiral blade 67, i.e., controlling the operation of the drive motor 42.

The amount of the paste remaining in the container 31 is decreased due to the feed of the paste as described above. Since the paste is not very high in flowability and has high adhesion, a part of the paste however remains. adhered to the inner wall surface of the container 31 Further, air may be entrained in the paste situated uppermost in the container 31 in some cases. These phenomena make it impossible not only to feed the whole paste in the container 31 but also to satisfactorily effect the above-described kneading of the paste, the adjustment of its viscosity and the control of its feed rate.

Figure 8:
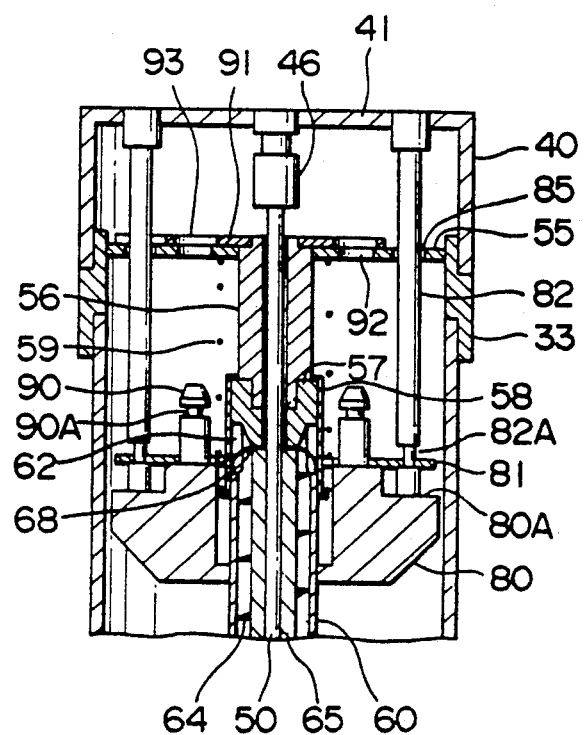
FIG. 8 is a cross-sectional view illustrating a state that a piston has been lowered in the paste feeding apparatus according to the first embodiment of this invention.

Since the piston 80 is provided within the container 31, the above-described phenomena can however be solved by operating this piston. Namely, the air cylinders 43 are driven to elongate the cylinder heads 82 downward. As a result, the piston 80 is forced down by the cylinder heads 82 as illustrated in FIG. 8, and hence moved downward in the container 31. At this time, the cylinder heads 82 are in a interlocked state relative to the cylinder head locking plate 81, and its lower end surface comes into contact with an upper surface 80A of an outer peripheral edge of the piston 80. The piston 80 is hence subjected to lowering force by the cylinder heads 82. On the other hand, the piston locking pins 90 are in an uninterlocked state relative to the piston locking plate 91, and hence pass through the interlocking holes 93 in the piston locking plate 91 and the pin-passing holes 92 in the supporting plate part 55 as the piston 80 is lowered.

When the piston 80 is lowered, the sliding sleeve 58 is lowered together with the piston 80 along the outer peripheries of the support column 56 and connecting sleeve 57 by the action of the large-expanded coil spring 59, so that the peripheral edge of the scraping member 68 provided at the lower end of the connecting sleeve 57 is bent downward to close the paste outlet 62 thereafter. At this time, the paste situated near the paste outlet 62 is scraped by the scraping member 68 and the sliding sleeve 58 closes the paste outlet 62. It is hence possible to prevent the paste from leaking out above the piston 80 even when the piston 80 is moved down below the paste outlet 62.

As described above, the lowering of the piston 80 permits scraping of the paste adhered to the inner wall surface of the container 31 and moreover collapse of air bubbles entrained in the paste. As described above, it is possible to surely achieve the kneading of the paste in the container 31, the adjustment of its viscosity and the control of its feed rate owing to the action of the piston 80.

Figure 9:
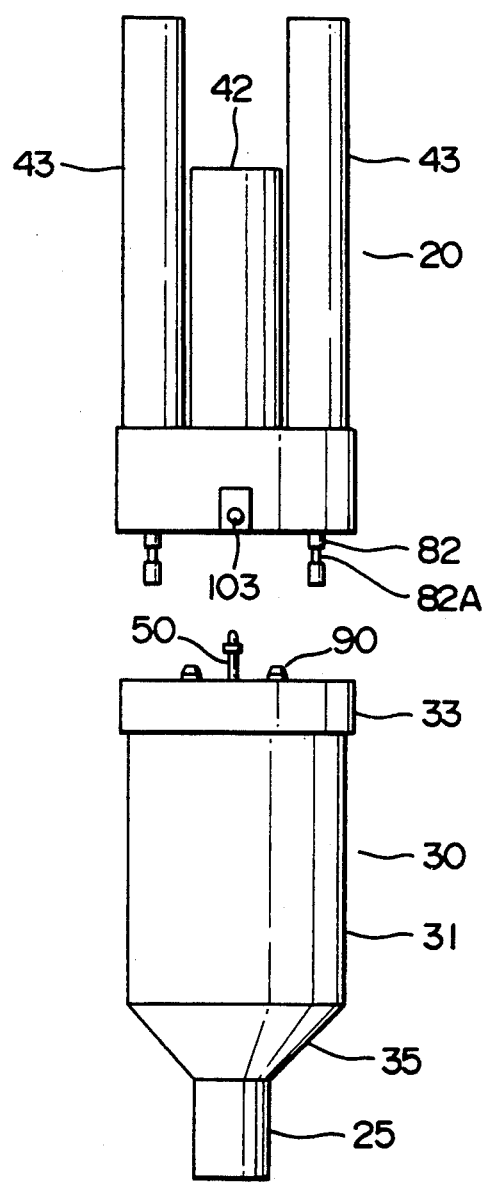
FIG. 9 illustrates a state that a pump-container section has been removed from a drive section in the paste feeding apparatus according to the first embodiment of this invention.

In this paste feeding apparatus 10, it is also possible to separate the drive section 20 and the pump-container section 30 from each other. When the use of the paste-feeding apparatus 10 is suspended, the pump-container section 30 can be separated from the drive section 20 as illustrated in FIG. 9. This allows the pump-container section 30 alone to store in a low-temperature atmosphere, for example, a refrigerator or the like. It is hence possible to prevent the deterioration of the unused paste remaining in the container 31.

Described specifically, the interlock-releasing button 103 is pushed down against the spring 101 to release the engagement of the protruding piece 102 with the through-hole 100, so that the coupling part 33 becomes turnable relative to the cap part 40 of the drive section 20.

The coupling par-t 33 can then be turned to make the pump-container section 30 a removable state. Namely, when the coupling part 33 is turned in a release direction (clockwise direction in FIG. 6) by a predetermined angle relative to the drive section 20, the interlocking holes 83 in the cylinder head locking plate 81 are shifted to an uninterlocked position relative to the cylinder heads 82, and at the same time, since the piston locking pins 90 are inserted through the pin-passing holes 92 in the supporting plate part 55, the piston 80 is turned together with the coupling part 33 through these interlocking. At this time, the cylinder heads 82 are relatively moved in the arcuate through-holes 85 in the supporting plate part 55. As a result, the engaging parts 112 of the piston locking plate 91 become disengaged from the cylinder heads 82. However, the free piston locking plate 91 is in fact shifted in a counter-clockwise direction by the action of the spring 110, so that the interlocking holes 93 in the piston locking plate 91 becomes an interlocked state relative to the piston locking pins 90.

In consequence, all the components other than those belonging to the drive section 20 become supported on the coupling part 33 through the supporting plate part 55. Therefore, the pump-container section 30 can be separated from the drive section 20 by releasing the connection of the drive shaft 50 through the coupling 46.

Incidentally, the connection of the drive motor 42 with the drive shaft 50 through the coupling 46 can be detachably performed with ease by any suitable connecting mechanisms of various types. For example, the hole in the coupling 46 may be designed in the form of a square hole, and the upper end of the drive shaft 50 may be shaped in the form of a square pillar.

In the above-described embodiment, it is further possible to remove the container 31 from the coupling part 33. For example, if the container 31 is emptied by discharging the whole paste contained therein, such a container 31 may therefore be removed from the coupling part 33 to install a new container 31 filled with the paste to the coupling part 33. It is also possible to conduct the cleaning of the spiral pump portion and the like with ease.

In the above-described paste feeding apparatus 10, it is also possible to use a motor-driven piston as a drive source for driving the piston without recourse to the air cylinders. Further, it goes without saying that in order to detachably install the pump-container section to the drive section, other mechanisms of various types may be used.

FIG. 10 is a cross-sectional view illustrating an exemplary basic construction of a paste feeding apparatus 210 according to the second embodiment of the present invention. This paste feeding apparatus 210 is equipped with a cylindrical container 211. This container 211 basically comprises a cylindrical container body 212 provided so as to vertically extend and an upper cover 213 airtightly connected to an upper part of the container body 212 and having the same inside diameter as that of the container body 212. A vertical cylindrical paste-feeding part 215 having a smaller diameter is integrally formed through a conical part 214 at the lower end of the container body 212. A paste feeding opening 216 is defined at the lower end of the cylindrical paste-feeding part 215. On the upper cover 213 on the container body 212, is disposed a drive motor 217 having a torque meter (not illustrated) and are provided a pair of air connectors 218, 219.

In the container 211 is disposed a mantle tube 220 having an outside diameter smaller than an inside diameter of the container 31 and fixed to the upper cover 213 at its upper end. A cylindrical lower open end part of a lower part 221 of the mantle tube 220, said lower part 221 being situated within the container body 212, is fitted into a cylindrical lower end part of the conical part 214 of the container body 212, and is communicated through its opening 222 with the cylindrical paste-feeding part 215. A paste inlet 223 is defined by a hole passing through the peripheral wall of the mantle tube 220 at a lower end of the lower part 221 of the mantle tube 220. Moreover, a paste outlet 224 is defined by the same through-hole as described above at an upper end of the lower part 221. A spiral pump 226 is constructed by the lower part 221 of this mantle tube 220 and a screw shaft 225 coaxially provided in the interior thereof.

The screw shaft 225 comprises a spiral blade 228 fixed around a rotating shaft 227 which vertically extends. A spiral groove 229 is defined by a space between crests of the spiral blade 228. An upper part of the rotating shaft 227 relating to this screw shaft 225 is rotatably supported by a bearing mechanism 231 provided within an upper part 230 of the mantle tube 220, and its upper end is connected through a connecting mechanism 232 to a drive shaft 233 of the drive motor 217 disposed on the upper cover 213 on the container 211.

On the other hand, a lower part of the rotating shaft 227 is protruded downward from the opening 222 of the mantle tube 220 and is situated in the cylindrical paste-feeding part 215 of the container body 212, and a spiral blade 241 in the same direction as that of the spiral blade 228 is provided thereon. This constructs a paste feeding section 240.

Within the container 211 is provided an air piston 250 which moves up and down in an annular space defined between the mantle tube 220 and the container 211 in a state fitted on the outer peripheral surface of the mantle tube 220. This air piston 250 comprises a central part 251 having a conical bottom surface fit for the conical part 214 situated at the lower end of the container body 212 and a outer peripheral edge part 252 which permits the movement of the piston along the inner peripheral surface of the container 211.

An air tube 255 which extends from one 218 of the pair of air connectors 218, 219 is connected to a through-hole 253 defined in the central part 251 of the air piston 250 and opened to a lower area S1 of the annular space. This air tube 255 has a length enough to permit the lowering of the air piston 250. When the air piston 250 is lifted as illustrated in FIG. 10, the excess portion of the air tube 255 is received in an upper area S2 of the annular space, which is above the air piston 255. The other air connector 219 is communicated with this upper area S2.

Figure 11:
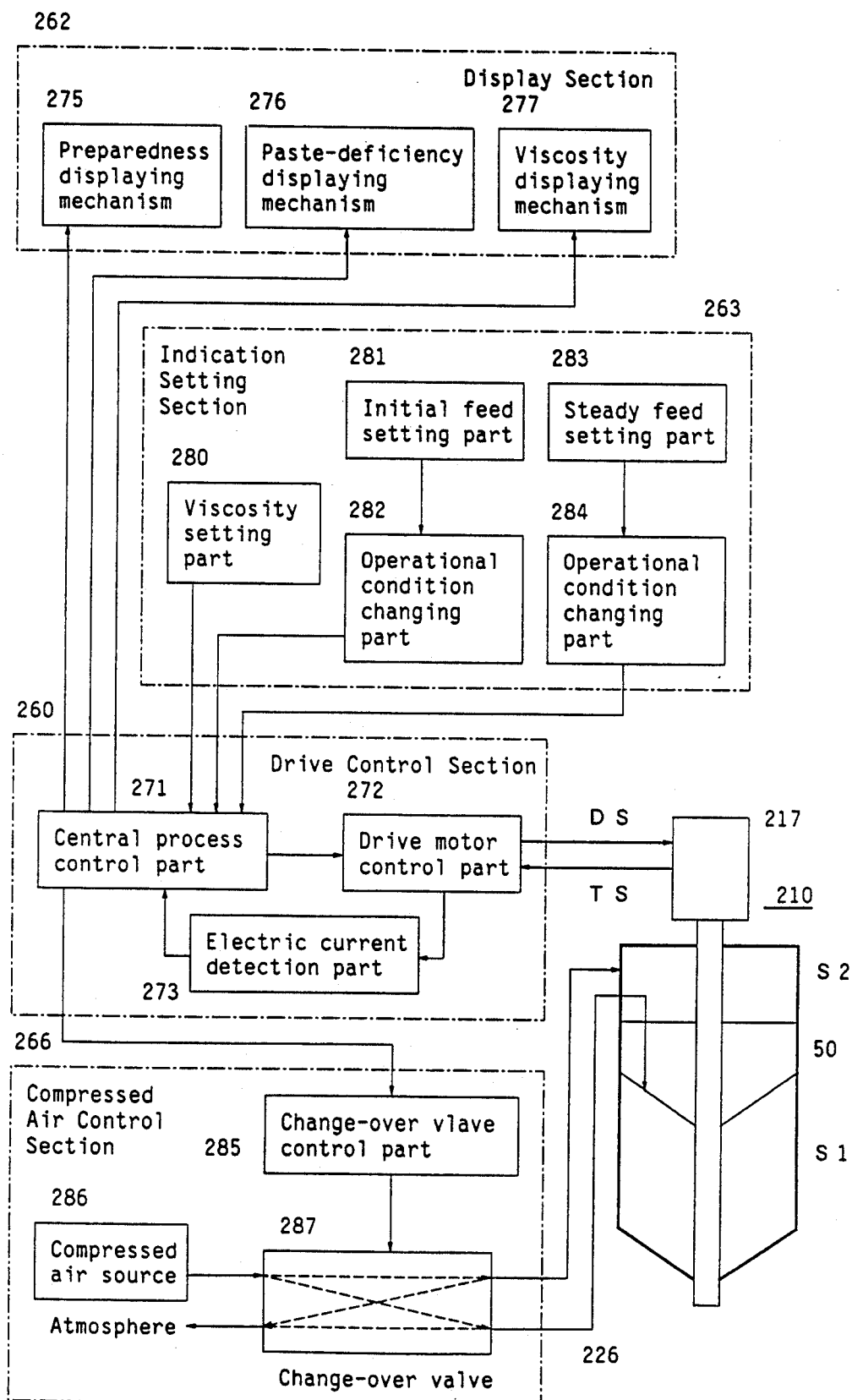
FIG. 11 is a schematic block diagram illustrating an exemplary drive control system used in the paste feeding apparatus according to the second embodiment of the present invention.

A drive control system having a function of receiving a detection torque signal from the torque meter provided on the drive motor 217 to control the rotation of the drive motor 217 according to this signal is provided. FIG. 11 illustrates an exemplary construction of the drive control system. The drive control system in this example comprises a drive control section 260, a display section 262, an indication setting section 263, a power source section (not illustrated) and a compressed air control section 266. The drive control section 260 comprises a central process control part 271, a drive motor control part 272 and an electric current detection part 273. The drive motor 217 is driven according to a drive signal DS from the drive motor control part 272, and at the same time, a detection torque signal TS from the torque meter provided on the drive motor 217 is fed back as a control signal to the drive motor control part 272.

The display section 262 is provided with, for example, a preparedness displaying mechanism 275 for indicating that the paste feeding apparatus is ready for operation, a paste-deficiency displaying mechanism 276 for indicating that the amount of the paste in the container 211 is insufficient, a viscosity displaying mechanism 277 for indicating the viscosity of the paste, etc. The indication setting section 263 is provided with a viscosity setting part 280, an initial feed setting part 281 for the paste and an operational-condition changing part 282 for changing over its automatic-manual conditions, a steady feed setting part 283 and an operational-condition changing part 284 for changing over its automatic-manual conditions, etc.

The compressed air control section 266 has a compressed air source 286 and a change-over valve 287. One of the air connectors 218, 219 in the paste feeding apparatus 210 is connected to the compressed air source 286 through the change-over valve 287 by means of a change-over valve control part 285, which is operated in accordance with a control signal from the central process control part 271 in the drive control section 260 and moreover, the other air connector is caused to communicate with the atmosphere. It is preferable to interpose an air filter, a regulator, a pressure indicator, etc. in a compressed air passage ranging from the compressed air source 286 to the change-over valve 287 as necessary.

In the embodiment illustrated in FIG. 10, the container body 212 is made of, for example, a resin and is provided with a container body holding cover 290 made of a metal, which is detachably fixed to the upper cover 213 to ensure the installation of the container body 212.

The paste feeding apparatus 210 composed of the above-described components is basically operated in the same manner as described in the first embodiment. Namely, the paste in the container body 212 is circulated by the normally rotating operation of the spiral pump 226, and is kneaded by continuously conducting such normally rotating operation of the spiral pump 226 It is therefore possible to keep the paste uniform.

In this second embodiment, the air piston 250 is provided within the container 211. When compressed air is introduced in the upper area S2 of the annular space, which is above the upper part of the air piston 250, through the air connector 219, the air piston 250 is lowered. At this time, since the outer peripheral edge part 252 is moved along the inner peripheral surface of the container 211, the paste adhered thereon is scraped off and moreover, air bubbles entrained in the paste is collapsed owing to the shock applied to the upper surface of the paste. As described above, it is possible to surely achieve the kneading of the paste in the container body 212, the adjustment of its viscosity and the control of its feed rate owing to the action of the piston 250.

Since the air within the lower area S1 of the annular space is discharged into the atmosphere by way of the air tube 255 through the through-hole 253 defined in the air piston 250 when the air piston 250 is lowered, it is preferred that a ball valve or the like is provided in the through-hole 253 so as to prevent its blocking by the paste. To the contrary, when the air piston 250 is lifted, compressed air is introduced into the lower area S1 of the annular space, and the air within the upper area S2 is discharged into the atmosphere.

Further, since the lower surface of the central part 251 of the air piston 250 is in a conical form fit for the conical part 214 situated at the lower end of the container body 212, the paste in the container body 212 can be completely discharged to easily empty the container body 212. Incidentally, it is preferable to prepare a cap for closing the paste feeding opening 216 when making no use of the apparatus. By the way, a motor-driven piston may be used instead of the air piston.

In order to charge the paste into the container body 212, it is only necessary to do, for example, in the following manner. Namely, a packaging container in the same form as the container body 212 separated alone is provided to fill it with a paste and then seal it hermetically. This container is then installed to the paste feeding apparatus 210 from which the container body 212 is removed. Thereafter, the container body holding cover 290 is attached to the upper cover 213. It is preferable to leave the spiral pump 226 normally rotated during the operation of installing the container body 212 filled with the paste.

Although the present invention has been described as to the preferred embodiments, various variations can be made in this invention. For example, in order to feed the paste through the paste feeding opening, the piston may be lowered without recourse to the reverse operation of the spiral pump. In this case, the precision of the control with respect to the feed rate of the paste is somewhat lowered. However, this suffices in the case where no rigid control is required.

What is claimed is:

1. A paste feeding apparatus comprising a vertical cylindrical container; a paste feeding opening defined in a lower end of the container; a spiral pump composed of a mantle tube vertically provided within the container and having a paste inlet and a paste outlet, which are spacedly formed at lower and upper positions, respectively, and having an outside diameter smaller than an inside diameter of the container, and a screw shaft provided coaxially within the mantle tube and having a spiral blade or groove; a drive motor provided in connection with the screw shaft of the spiral pump; and a piston moving up and down in an annular space about the mantle tube in the container.

2. The paste feeding apparatus as claimed in claim 1, wherein the container has a vertical cylindrical paste-feeding part having a smaller diameter at its lower end, in the interior of said cylindrical paste-feeding part being formed a spiral blade or groove in the same direction as that of the screw shaft.

3. The paste feeding apparatus as claimed in claim 1, which comprises further a raking blade which is connected to the screw shaft to be rotated and serves to rake a paste in the paste inlet of the mantle tube.

4. The paste feeding apparatus as claimed in claim 3, wherein the raking blade has an outer blade portion for moving the paste on the inside along the radial direction by its rotation and an inner blade portion for lifting the paste moved on the inside along the radial direction to introduce it into the paste inlet.

5. The paste feeding apparatus as claimed in claim 1, wherein the drive motor is provided with a torque sensor.

6. The paste feeding apparatus as claimed in claim 1, wherein the piston is driven by an air cylinder or a motor-driven piston.

7. The paste feeding apparatus as claimed in claim 1, wherein the piston makes up an air piston or a motor-driven piston.

8. A paste feeding apparatus as claimed in claim 1, which comprises a drive section and a pump-container section, said pump-container section being composed of the vertical cylindrical container; the paste feeding opening defined in the lower end of the container; the spiral pump composed of the mantle tube vertically provided within the container and having the paste inlet and the paste outlet, which are spacedly formed at the lower and upper positions, respectively, and having the outside diameter smaller than the inside diameter of the container, and the screw shaft provided coaxially within the mantle tube and having said spiral blade or groove; and said piston moving up and down in said annular space about the mantle tube in the container, and said drive section comprising said drive motor detachably connected to the screw shaft of the spiral pump and a piston-driving source detachably connected to the piston.

9. The paste feeding apparatus as claimed in claim 8, which comprises further a raking blade which is connected to the screw shaft to be rotated and serves to rake a paste in the paste inlet of the mantle tube.

10. The paste feeding apparatus as claimed in claim 8, wherein the piston is driven by an air cylinder.

* * * * *